United States Patent
Lindblad et al.

(10) Patent No.: US 10,168,038 B1
(45) Date of Patent: *Jan. 1, 2019

(54) SOLID STATE LIGHTING (SSL) APPARATUS HAVING ELECTRICALLY CONDUCTIVE SHEETS COUPLED TO SOLID STATE LIGHTING ON AN SSL ELEMENT CARRIER

(71) Applicant: AUTOMATED ASSEMBLY CORPORATION, Lakeville, MN (US)

(72) Inventors: Scott Lindblad, Chaska, MN (US); David Neuman, Randolph, MN (US)

(73) Assignee: Automated Assembly Corporation, Lakeville, MN (US)

( * ) Notice: Subject to any disclaimer, the term of this patent is extended or adjusted under 35 U.S.C. 154(b) by 25 days.

This patent is subject to a terminal disclaimer.

(21) Appl. No.: 15/469,773

(22) Filed: Mar. 27, 2017

Related U.S. Application Data

(63) Continuation-in-part of application No. 14/575,648, filed on Dec. 18, 2014, now Pat. No. 9,606,285.

(51) Int. Cl.
*F21V 23/06* (2006.01)
*F21V 23/00* (2015.01)
*F21V 17/10* (2006.01)
*H05B 37/02* (2006.01)

(52) U.S. Cl.
CPC .......... *F21V 23/001* (2013.01); *F21V 17/101* (2013.01); *F21V 23/06* (2013.01); *H05B 37/0209* (2013.01)

(58) Field of Classification Search
CPC .. G02B 6/0083; G02B 6/0085; G02B 6/0072; G02B 6/0081; F21Y 2101/002; F21Y 2103/003; F21Y 2105/001; F21Y 2105/003; F21Y 2105/005; F21Y 2105/006; F21Y 2105/008; F21Y 2115/10; F21V 23/06
USPC ....................................................... 362/612
See application file for complete search history.

(56) References Cited

U.S. PATENT DOCUMENTS

| | | | |
|---|---|---|---|
| 7,705,365 | B2 | 4/2010 | Kurokawa et al. |
| 7,990,512 | B2 | 8/2011 | Yang |
| 9,128,222 | B1 | 9/2015 | Lindblad et al. |
| 2013/0051067 | A1 | 2/2013 | Chen |
| 2013/0099275 | A1 | 4/2013 | Pi et al. |

*Primary Examiner* — Robert J May
(74) *Attorney, Agent, or Firm* — Crawford Maunu PLLC

(57) ABSTRACT

A disclosed lighting apparatus includes a light-diffusive plate having opposing first and second faces bounded by one or more sides. A first electrically conductive sheet is disposed on the first face of the light-diffusive plate, and an electrically insulative sheet is disposed on the first electrically conductive sheet. A second electrically conductive sheet is disposed on the electrically insulative sheet. A plurality of solid-state lighting (SSL) elements have light emitting portions that face a portion of the light-diffusive plate. The SSL elements are electrically coupled to the first electrically conductive sheet and to the second electrically conductive sheet.

41 Claims, 8 Drawing Sheets

SOLID STATE LIGHTING (SSL) APPARATUS HAVING ELECTRICALLY CONDUCTIVE SHEETS COUPLED TO SOLID STATE LIGHTING ON AN SSL ELEMENT CARRIER

FIELD OF THE INVENTION

The disclosed embodiments generally relate to a solid-state lighting (SSL) apparatus.

BACKGROUND

Solid-state lighting (SSL) apparatuses have semiconductor structures that emit light. Examples of SSL lighting elements include light-emitting diodes (LEDs), semiconductor laser diodes (LDs), organic light-emitting diodes (OLED), polymer light-emitting diodes (PLED), or quantum dots. SSL is becoming more popular due in part to the energy efficient qualities and durability of SSL. Applications for SSL may include advertising signage, decorations, or utility and general purpose lighting. In some implementations, SSL elements are placed along one or more edges of a light-transmitting panel, and the light-transmitting panel is configured to evenly distribute light emitted from the SSL elements through a surface of the panel.

With an edge-lit light-transmitting panel, light from the SSL elements is spread evenly through the panel by total internal reflection. Disruptions formed on the surface of the panel scatter incident light so that light is emitted from the surface of the panel.

SUMMARY

One lighting apparatus includes a light-diffusive plate having opposing first and second faces bounded by one or more sides. A first electrically conductive sheet is disposed on the first face of the light-diffusive plate, and an electrically insulative sheet is disposed on the first electrically conductive sheet. A second electrically conductive sheet is disposed on the electrically insulative sheet. A plurality of solid-state lighting (SSL) elements have light emitting portions that face a portion of the light-diffusive plate. The SSL elements are electrically coupled to the first electrically conductive sheet and to the second electrically conductive sheet.

In another embodiment, a method of making a lighting apparatus includes disposing a first electrically conductive sheet on a first face of the light-diffusive plate. The light-diffusive plate has opposing first and second faces bounded by one or more sides. A plurality of SSL elements are connected to the first electrically conductive sheet with the plurality of SSL elements arranged to emit light toward a portion of the light-diffusive plate. An electrically insulative sheet is disposed on the first electrically conductive sheet. A second electrically conductive sheet is disposed on the electrically insulative sheet, and the SSL elements are connected to the second electrically conductive sheet.

The above summary is not intended to describe each disclosed embodiment. The figures and detailed description that follow provide additional example embodiments and aspects.

BRIEF DESCRIPTION OF THE DRAWINGS

Other aspects and advantages will become apparent upon review of the Detailed Description and upon reference to the drawings in which.

DETAILED DESCRIPTION

Figure 1:
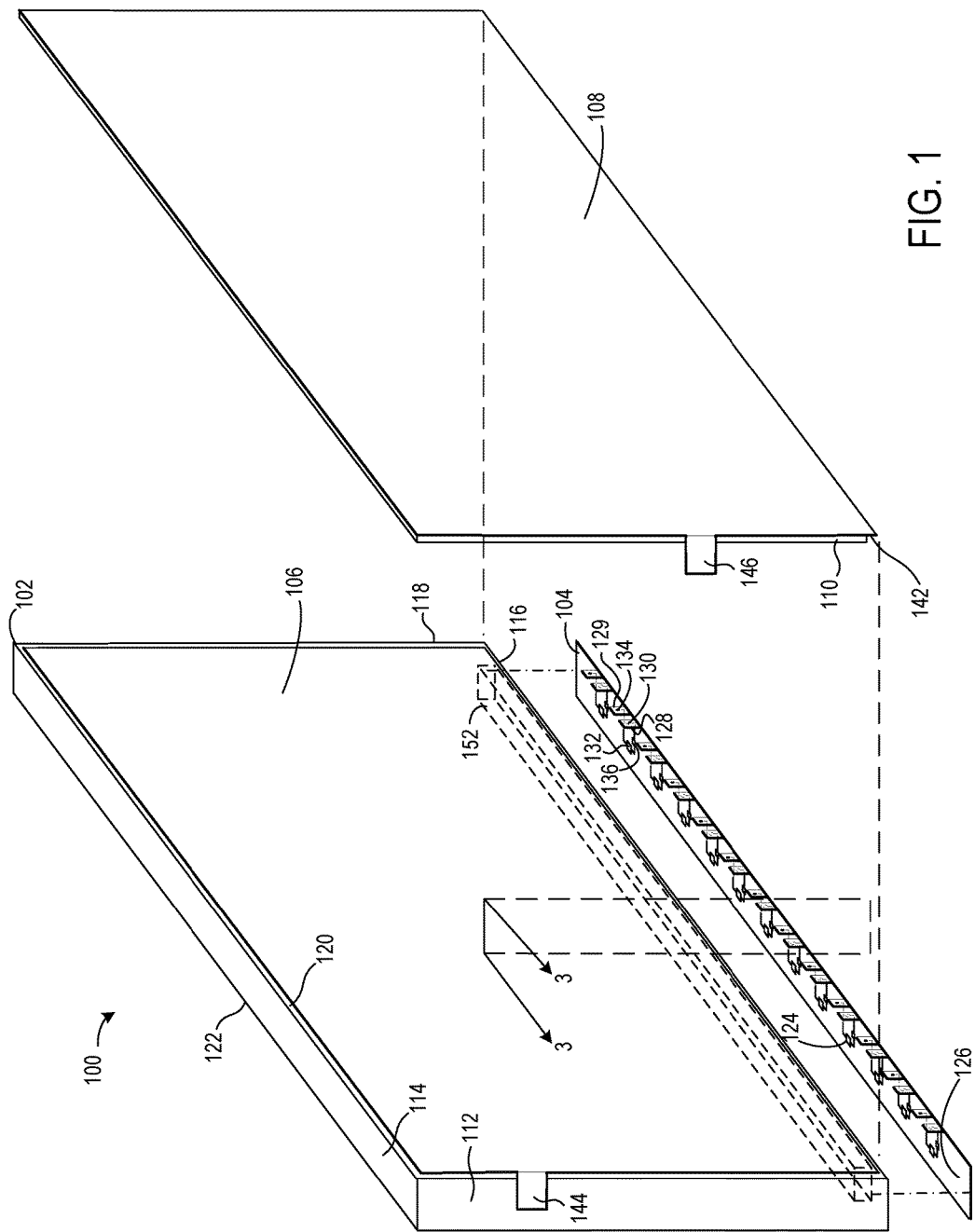
FIG. 1 shows an exploded view of a lighting apparatus.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

This disclosure describes an SSL apparatus that provides even distribution of current to the SSL elements and efficient dissipation of heat from the SSL elements. The SSL apparatus is adaptable for various applications, including signage or general lighting.

The lighting apparatus includes a light-diffusive plate that has disruptions formed on one of the faces for scattering internally reflected light. SSL elements are attached to an SSL element carrier, and the SSL element carrier is attached to the light-diffusive plate such that light emitting portions of the SSL elements face one of the sides that surround the faces of the light-diffusive plate. Power terminals are disposed on another portion of the SSL element carrier. A first electrically conductive sheet is disposed on the light-diffusive plate on the face having the disruptions. The first electrically conductive sheet is electrically and mechanically coupled to the first terminals on the SSL element carrier. An electrically insulative sheet is disposed on the first conductive sheet, and a second electrically conductive sheet is disposed on the electrically insulative sheet. The second electrically conductive sheet is electrically and mechanically coupled to the second terminals on the SSL element carrier.

FIG. 1 shows an exploded view of a lighting apparatus 100 according to one implementation. The lighting apparatus includes a light-diffusive plate 102, an SSL element carrier 104, first and second electrically conductive sheets 106 and 108, and an electrically insulative sheet 110 disposed between the first and second electrically conductive sheets. The first and second electrically conductive sheets 106 and 108, which are illustrated with thicker line segments, may be aluminum or copper, depending on implementation requirements. Also, the thickness of the electrically conductive sheets may vary, such as from foil to thicker sheets. The evenness of current distribution and ability to dissipate heat by the electrically conductive sheets may vary according to the surface area and thickness of the sheets.

The light-diffusive plate 102 has opposing first and second faces 120 and 122 that are bounded by one or more sides. In the illustrated example, the light-diffusive plate is rectangular and has four sides, with sides 112 and 114 exposed and sides 116 and 118 hidden in the view. The first face 120 is mostly obscured by the electrically conductive sheet 106, and the opposing second face 122 is hidden in the view. The light-diffusive plate has multiple disruptions (not shown in FIG. 1; see FIGS. 3 and 4) on the first face. Though not shown in FIG. 1, the light-diffusive plate has disruptions formed on one face 120 of the opposing faces of the plate. With an edge-lit lighting apparatus, light from the SSL elements is spread evenly through the light-diffusive plate by total internal reflection. The disruptions formed on the surface of the plate scatter incident light so that light is emitted from the face of the plate having the disruptions. Another implementation has disruptions formed on both face 120 and the opposing face 122 of the light-diffusive plate.

In one implementation, the light-diffusive plate is made from a transparent thermoplastic such as polymethyl methacrylate (PMMA or "acrylic glass"). The light-diffusive plate 102 may be any polygon or a shape bounded by one or more curved sides, such as a circle, ellipse, or an irregular shape.

The first electrically conductive sheet 106 is disposed on the first face 120 of the light-diffusive plate 102 and may be attached to the light-diffusive plate with adhesive between edge areas of the electrically conductive sheet and the light-diffusive plate. In alternative implementations, a frame (not shown) may hold together the electrically conductive sheets 106 and 108, the insulative sheet 110, the SSL element carrier 104, and the light-diffusive plate.

Multiple SSL elements 124 are attached to a portion 126 of the SSL element carrier 104, and the SSL element carrier is attached to the light-diffusive plate 102 such that light-emitting portions of the SSL elements face one of the sides of the light-diffusive plate. In lighting apparatus 100, the SSL elements face side 116 of the light diffusive plate 102. The SSL elements 124 may be packaged SSL elements or bare dice.

On the SSL element carrier 104, the SSL elements 124 are connected to respective terminals that are disposed on a second portion of the carrier. In an example of an implementation of the SSL element carrier, the second portion of the carrier includes respective tabs for the terminals. For example, tabs 128 and 129 have terminals 130 and 134, respectively. For each SSL element, a respective pair of terminals includes one terminal coupled to the anode of the SSL element, and another terminal coupled to the cathode of the SSL element. For example, terminal 130 is coupled to the anode of SSL element 132, and terminal 134 is coupled to the cathode. A current control device, such as a resistor, may be coupled between one of the power terminals and the anode/cathode. For example, current control device 136 is coupled between terminal 130 and the SSL element 132. Though not shown, it will be appreciated that the SSL element carrier 104 may further include terminals for connecting to control inputs of the SSL elements.

In one implementation, the SSL element carrier may be a flexible substrate, such as a polyimide substrate, and the terminals for connecting to the anodes and cathodes of the SSL elements may be copper and disposed on opposing surfaces of the portion 128. For example, terminal 130 may be disposed on the surface of portion 128 that is hidden from view (the terminal is represented by the dashed outline), and terminal 134 may be disposed on the surface of the portion 128 that is exposed in the view and faces the electrically insulative layer 110 and electrically conductive sheet 108. Copper traces on or within the substrate connect the terminals to the SSL elements. In another implementation, the SSL element carrier may be a lead frame or a rigid substrate.

The SSL element carrier 104 is attached to the light-diffusive plate 102 such that the positive terminals (the terminals that are connected to the anodes of the SSL elements, e.g., terminal 130) face the first electrically conductive sheet 106. The first electrically conductive sheet 106 is disposed between the face 120 of the light-diffusive plate and the positive terminals, thereby permitting mechanical and electrical connections to be established between the terminals and the sheet 106.

The electrically insulative sheet 110 is disposed on the first electrically conductive sheet 106 and insulates the first electrically conductive sheet from the second electrically conductive sheet 108. Adhesive may be used to attach the electrically insulative sheet to the first electrically conductive sheet, and the second electrically conductive sheet to the electrically insulative sheet. A portion 142 of the second electrically conductive sheet extends beyond the insulative sheet and contacts the negative terminals (the terminals that are connected to the cathodes of the SSL elements, e.g., terminal 134) on the SSL element carrier 104, thereby permitting mechanical and electrical connections to be established between the terminals and the second electrically conductive sheet. The electrically conductive sheets 106 and 108 may include respective tabs 144 and 146 for connecting to a power source.

In some implementations, the anode terminals (e.g., 130) may be connected to the first electrically conductive sheet 106 with weld joints. Similarly, the cathode terminals (e.g., 134) may be connected to the second electrically conductive sheet 108 with weld joints. The welding of dissimilar metals (such as copper terminals and an aluminum sheet) provides strong and durable joints.

The lighting apparatus 100 may have multiple SSL element carriers (not shown) in another implementation. For example, a second SSL element carrier (not shown) may be attached to the light-diffusive plate 102, with the SSL elements of the second SSL element carrier facing side 114 of the light-diffusive plate. The terminals of the second SSL element carrier may be connected to the first and second electrically conductive sheets as described above.

A channel(s) 152 may be formed along the side(s) 116 of the light-diffusive plate 102 in some implementations. The channel forms a recess large enough to accommodate the SSL elements 124 on the carrier 104, with the SSL element carrier disposed over the channel 152 such that the SSL elements are within the channel.

The arrangement of SSL elements in the channel may be varied according to implementation requirements. For example, different implementations may call for different sizes, numbers, and/or spacing of SSL elements. Also, there may be more than one row of SSL elements disposed in the channel. Another implementation may have more than one channel formed on the light-diffusive plate. For example, in addition to channel 152, another channel may be formed along side 114, and an SSL element carrier may be disposed over the channel. Other implementations may have multiple channels on a single side or multiple channels on multiple sides of the light-diffusive plate. Still other implementations may have the light diffusive plate without a channel and the SSL elements on the SSL element carrier(s) facing one or more of the sides of the light diffusive plate.

The lighting apparatus 100 has anodes of the SSL elements connected to the electrically conductive plate 106 and the cathodes of the SSL elements connected to the electrically conductive plate 108. It will be appreciated that in an alternative implementation, the cathodes of the SSL elements may be connected to the electrically conductive plate 106 and the anodes of the SSL elements may be connected to the electrically conductive plate 108.

Figure 2:
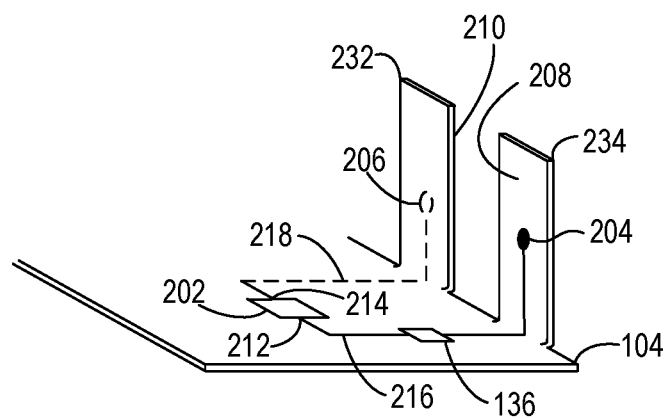
FIG. 2 shows a partial view of an SSL element carrier.

FIG. 2 shows a partial view of an SSL element carrier 104, along with an SSL element 202 and power terminals 204 and 206 connected to the SSL element according to one configuration of the power terminals on the carrier. The terminals 204 and 206 are disposed on opposing surfaces of the carrier. Terminal 204 is disposed on surface 208, and terminal 206 is disposed on surface 210. The terminals are coupled to the anode 212 and cathode 214 of the SSL element 202 by copper traces 216 and 218. Terminal 204 is coupled to the anode 212 through current control device 222. Placement of the terminals on the opposing surfaces of the SSL element carrier permits the SSL element carrier to be placed over the first electrically conductive sheet 106 and the electrically insulative sheet 110 and the second electrically conductive sheet 108 to be placed over the SSL element carrier for establishing connections between the terminals on the SSL element carrier and the electrically conductive sheets. The tabs 232 and 234 may be beneficial in guiding equipment to the desired sites for physically connecting the terminals to the electrically conductive sheets.

Figure 3:
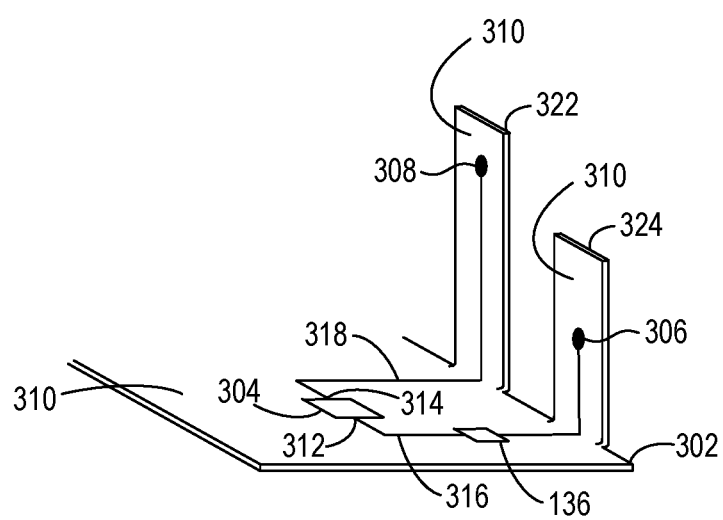
FIG. 3 shows a partial cross-sectional view of the lighting apparatus of FIG. 1 taken in the direction of cross-section lines 3.

FIG. 3 shows a partial view of an SSL element carrier 302, along with an SSL element 304 and power terminals 306 and 308 connected to the SSL element according to another configuration of the power terminals on the carrier. The terminals 306 and 308 are disposed on the same surface 310 of the carrier. The terminals are coupled to the anode 312 and cathode 314 of the SSL element 304 by copper traces 316 and 318. Terminal 306 is coupled to the anode 312 through current control device 136.

Terminal 308 is disposed on tab 322, and terminal 306 is disposed on tab 324. Tab 324 may be disposed over the first electrically conductive sheet 106 (FIG. 1) for connecting the terminal 306 to the first electrically conductive sheet, and tab 322 may be disposed over the second electrically conductive sheet 108 for connecting the terminal 308 to the second electrically conductive sheet. The tab configuration of FIG. 3 is different from the tab configuration of FIG. 2 in that the terminal 308 is on the same surface 310 of the SSL element carrier as terminal 306. In addition tab 322 is longer than tab 324. In the completed lighting arrangement, the longer tab 322 wraps around the sides of the electrically insulative sheet 110 (FIG. 1) and the second electrically conductive sheet 108 so as to contact the terminal 308 to the surface of the second electrically conductive sheet opposite the electrically insulative sheet.

Figure 4:
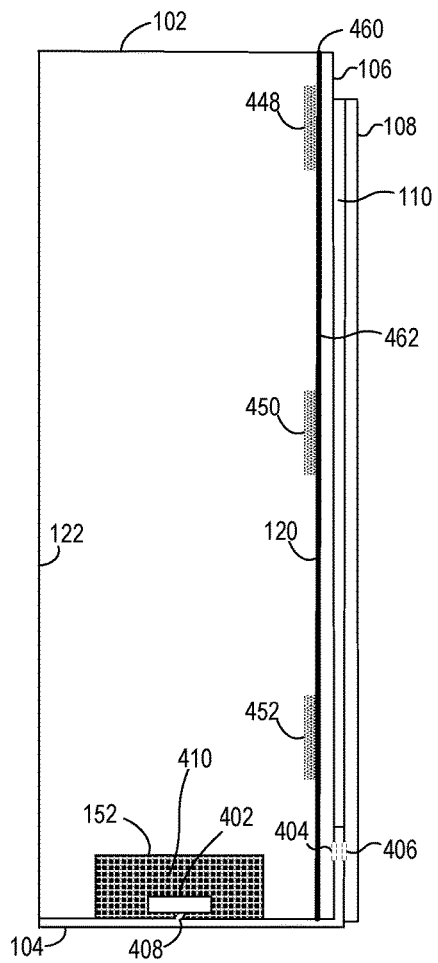
FIG. 4 shows a partial cross-sectional view of a lighting apparatus according to an implementation in which there is no channel in the side of the light-diffusive plate.

FIG. 4 shows a partial cross-sectional view of the lighting apparatus of FIG. 1 taken in the direction of cross-section lines 3. The cross-sectional view shows the electrically conductive sheets 106 and 108 connected to the SSL element carrier 104 in an implementation in which the light-diffusive plate 102 has a channel 152 that is covered by SSL element carrier 104. SSL element 402 may be mounted on the carrier 104 and connected to conductive traces (not shown) that are either on the surface of the carrier or in a layer of conductive traces in a multilayer arrangement. The terminals 404 and 406 are connected to the anode and cathode of the SSL element 402. Node 408 represents both the anode and cathode in the cross-sectional view, because the cross-section cuts across the SSL element between the anode and cathode.

In an example implementation, the channel 152 is filled with an ultra-violet (UV) curable encapsulant 410. In one implementation, the encapsulant serves to secure the SSL element carrier 104 to the light-diffusive plate 102 as well as to seal components from weather elements for outdoor applications. The encapsulant should be transparent and non-yellowing. In another implementation, a separate weather-tight adhesive may be used to secure the SSL element carrier to the light-diffusive plate. The encapsulant may be phosphor-filled or include an organic dye to shift the light (e.g., blue light) emitted from the SSL element 402 to a desired color (e.g., white).

For many signage applications, emission of an even level of light from the entire surface of the light-diffusive plate may be desirable. Different patterns of disruptions on light-diffusive plates may be used to different effect. One pattern that has been found to be particularly useful is an edge-to-edge pattern of disruptions formed on the surface of the plate. Disruptions 448, 450, and 452 are examples of the disruptions on face 120 of the light-diffusive plate 102. The disruptions may be laser etched as is known in the art. For applications in which multiple ones of the light-diffusive plates are disposed side by side, the pitch between the disruptions on two separate plates is equal to the pitch between disruptions on the same plate. In another implementation, disruptions may be formed on face 122 as well as on face 120.

In another implementation, a reflector 460, which is illustrated as a thick line, may be disposed between the first electrically conductive sheet 106 and the light-diffusive plate 102 in order to reflect light emitted from the face 120 of the light-diffusive plate. The reflector may be a coating on the face 120 of the light-diffusive plate, a coating on the surface 462 of the first electrically conductive sheet 106, or a sheet or film disposed between the face 120 of the light-diffusive plate and the surface 462 of the first electrically conductive sheet. For configurations in which the reflector is a sheet or film, the sheet or film may be ultrasonically welded to the light-diffusive plate.

Figure 5:
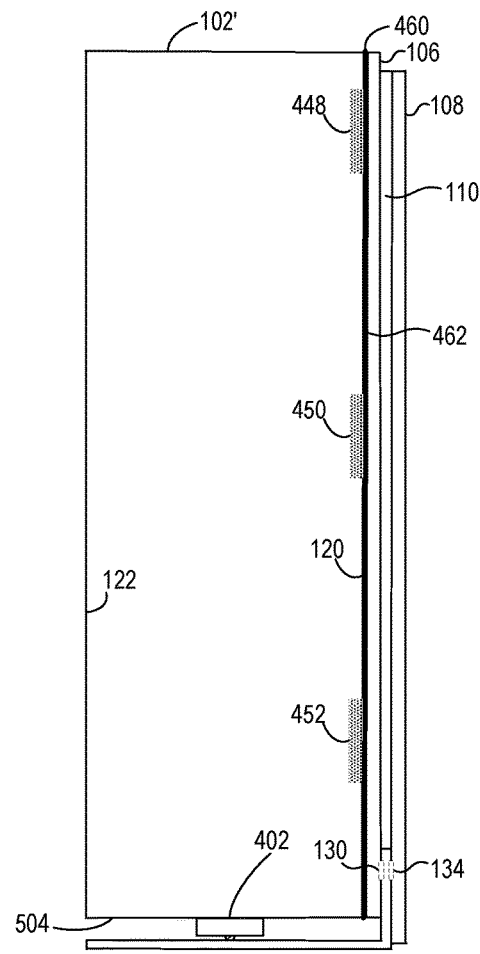
FIG. 5 is a flowchart of a process for constructing a lighting apparatus.

FIG. 5 shows a partial cross-sectional view of a lighting apparatus according to an implementation in which there is no channel in the side of the light-diffusive plate 102'. The elements of FIG. 5 are as described in the description of FIG. 4. However, light-diffusive plate 102' does not have the channel 152 of the light-diffusive plate 102. Thus, SSL element 402 faces side 504 of the light-diffusive plate 102'.

Figure 6:
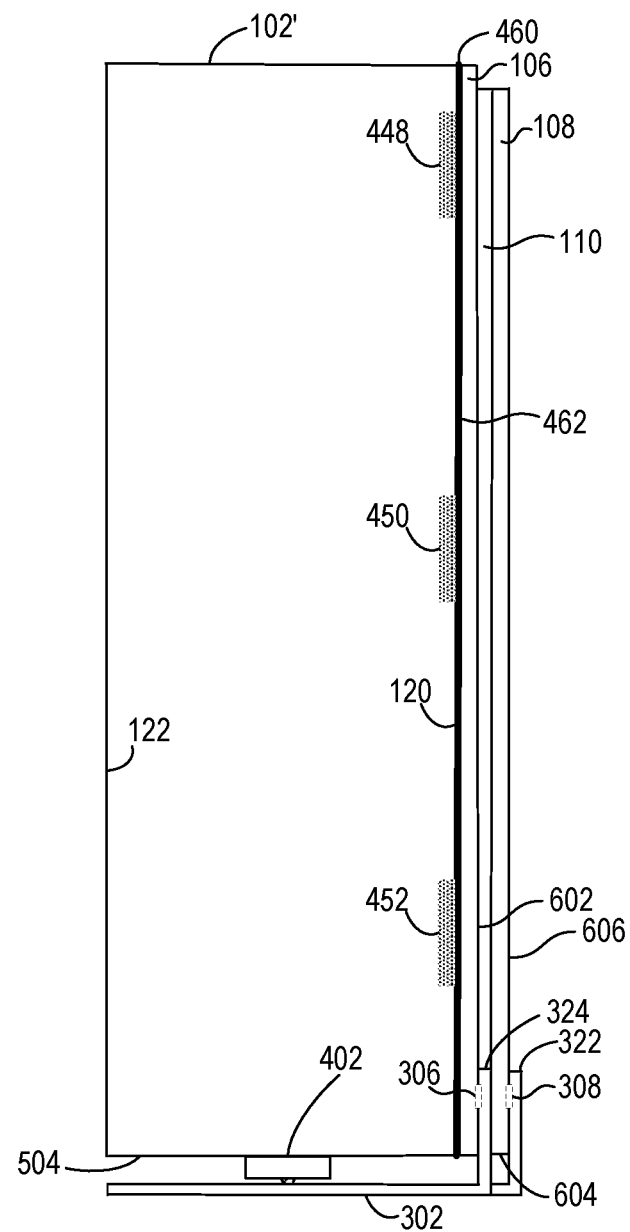
FIG. 6 shows a partial cross-sectional view of a lighting apparatus according to a configuration in which there is no channel in the side of the light-diffusive plate, and the terminals are disposed on the same surface of the SSL element carrier, which is illustrated in FIG. 3.

FIG. 6 shows a partial cross-sectional view of a lighting apparatus according to a configuration in which there is no channel in the side of the light-diffusive plate 102', and the terminals 306 and 308 are disposed on the same surface of the SSL element carrier 302, which is illustrated in FIG. 3. The elements of FIG. 6 are as described in the description of FIG. 4. However, light-diffusive plate 102' does not have the channel 152 of the light-diffusive plate 102. Thus, SSL element 402 faces side 504 of the light-diffusive plate 102'. Also, the SSL element carrier 302 has tabs 322 and 324, which include the terminals 308 and 306, respectively, and the terminals are on the same surface of the SSL element carrier as shown in FIG. 3. Tab 324 is disposed over surface 602 of the first electrically conductive sheet 106, providing contact between the terminal 306 and the first electrically conductive sheet. Tab 322 wraps around the side 604 of the second electrically conductive sheet 108, placing terminal 308 in contact with surface 606 of the second electrically conductive sheet.

Figure 7:
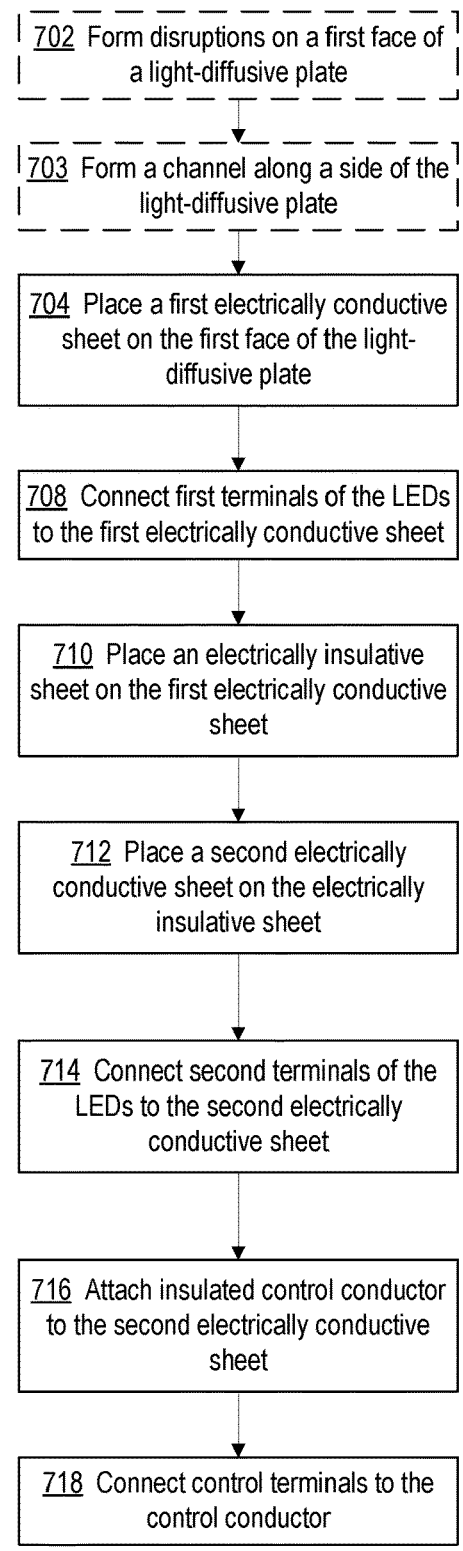
FIG. 7 is a flowchart of a process for constructing a lighting apparatus.

FIG. 7 is a flowchart of a process for constructing a lighting apparatus. The process of FIG. 7 may be adapted for either edge-lit or back-lit lighting apparatus. As such, the order of operations and the particular operations performed may vary according to the type of lighting apparatus. For an edge-lit lighting apparatus, at block 702, disruptions are formed in a light-diffusive plate. The disruptions may be formed by laser etching a pattern of dots on one of the faces of the light diffusive plate, for example. Disruptions may be unnecessary for a back-lit lighting apparatus.

Optionally, a channel(s) may be formed along one or more of the sides of the light-diffusive plate at block 703. The channel(s) may extend along a portion(s) of the side(s) and may be formed by mechanical cutting or grinding or by laser etching.

A first electrically conductive sheet is disposed on the face of the light-diffusive plate at block 704. The first electrically conductive sheet may be copper or aluminum and may be attached to the light-diffusive plate with an adhesive or subsequently secured to the light-diffusive plate along with other elements of the lighting apparatus with a frame.

At block 708, the SSL elements s are connected to the first electrically conductive sheet. For an edge-lit lighting apparatus, the SSL element may be attached to an SSL element carrier and the SSL element carrier attached to the light-diffusive plate. The SSL element carrier may have SSL elements attached to a first portion of the SSL element carrier and have first and second terminals coupled to the SSL elements. The SSL element carrier is attached to the light-diffusive plate such that the SSL elements s emit light toward a first side of the light-diffusive plate, and the first terminals face the first electrically conductive sheet. For a lighting apparatus having a channel, the SSL element carrier is attached to the light-diffusive plate such that the SSL elements on the SSL element carrier are disposed within the channel. The channel may be filled with an ultra-violet (UV) curable encapsulant, and the encapsulant may then be cured. Multiple SSL element carriers may be attached to the light-diffusive plate in some embodiments. The first terminals of the SSL element carrier are connected to the first electrically conductive sheet. The terminals and electrically conductive sheet may be welded or bonded with an electrically conductive adhesive.

For a back-lit lighting apparatus, the first conductive sheet may have openings formed therein. The SSL elements may be attached to the light-diffusive plate by disposing the SSL elements in the opening and connecting the SSL elements to the first electrically conductive plate. In an example implementation, the SSL elements may be connected to the first electrically conductive sheet by wire bonding terminals of the SSL elements to the first electrically conductive sheet. The wire bonds may be wedge bonds or ball bonds, for example.

At block 710, an electrically insulative sheet is disposed on the first electrically conductive sheet. An adhesive may be used to attach the electrically insulative sheet to the first electrically conductive sheet, or the electrically insulative sheet may be secured to the other parts of the lighting apparatus with a frame. The electrically insulative sheet may cover the first electrically conductive sheet in whole or in part, but is large enough to insulate the first electrically conductive sheet from the second electrically conductive sheet. For an edge-lit lighting apparatus, the second terminals on the SSL element carrier are not covered by the electrically insulative sheet and remain exposed for subsequent connection to the second electrically conductive sheet. For a back-lit lighting apparatus, the electrically insulative sheet has openings that are aligned with the openings in the first electrically conductive sheet, thereby permitting placement of the SSL elements in the openings.

At block 712, a second electrically conductive sheet is disposed on the electrically insulative sheet. The second electrically conductive sheet may be copper or aluminum and may be attached to the electrically insulative sheet with an adhesive or subsequently secured to the light-diffusive plate along with other elements of the lighting apparatus with a frame.

The SSL elements are connected to the second electrically conductive sheet at block 714. For an edge-lit lighting apparatus, the second terminals of the SSL element carrier are connected to the second electrically conductive sheet. The terminals and electrically conductive sheet may be welded or bonded with an electrically conductive adhesive.

For a back-lit lighting apparatus, the second electrically conductive sheet has openings formed therein, and the openings in the second electrically conductive sheet are aligned with the openings in the first electrically conductive sheet and in the electrically insulative sheet. The aligned openings permit the SSL elements to be placed with the light-emitting portions directed at the face of the light-diffusive plate and connections to be made between the SSL elements and the first and second electrically conductive sheets.

The method may further include adding another conductor to the lighting apparatus for providing control signals to the SSL elements. At block 716, an insulated control conductor is disposed on the second electrically conductive sheet. The insulated control conductor may include another electrically insulative sheet disposed on the second electrically conductive sheet and a third electrically conductive sheet disposed on the additional electrically insulative sheet. Alternatively, the insulated control conductor may be a conductive wire encased in an electrically insulative jacket and disposed on the second electrically conductive sheet.

At block 718, control terminals on the SSL elements are connected to the control conductor. For an edge-lit lighting apparatus, the SSL element carrier may have third terminals that are coupled to control terminals of the SSL elements, and the control terminals of the SSL element carrier may be connected to the control conductor. The control terminals of the SSL element carrier and the control conductor may be welded or bonded with an electrically conductive adhesive.

For a back-lit lighting apparatus having a second electrically insulative sheet and a third electrically conductive sheet, the second electrically insulative sheet and third electrically conductive sheet have openings that are aligned with the openings of the first electrically conductive sheet, the first electrically insulative sheet, and the second electrically conductive sheet. Control terminals on the SSL elements may be wire bonded to the third electrically conductive sheet. For a back-lit lighting apparatus having a control wire disposed on the second electrically conductive sheet, control terminals of the SSL elements may be wire bonded to the control wire.

Figure 8:
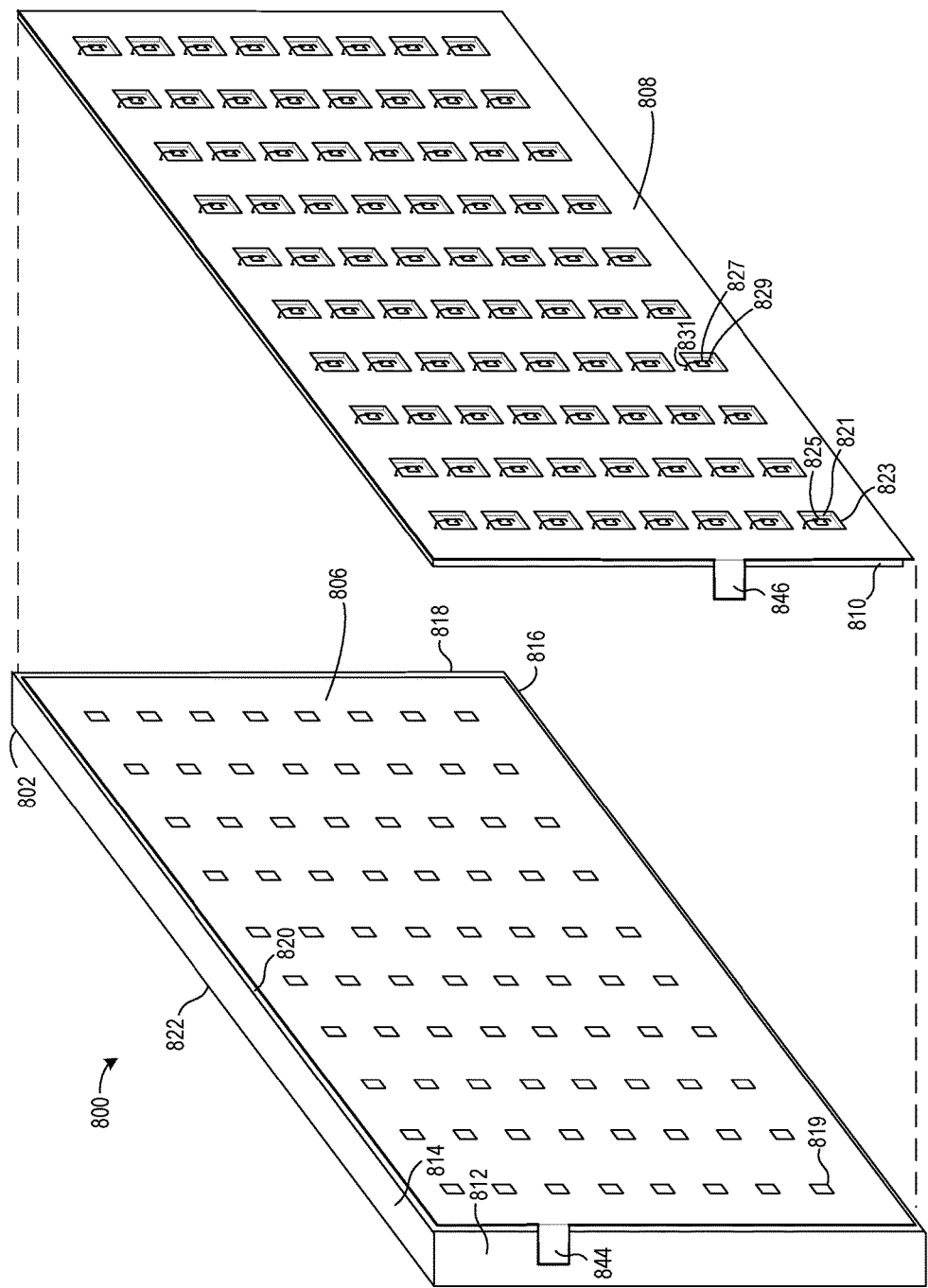
FIG. 8 shows an exploded view of a lighting apparatus according to another implementation.

FIG. 8 shows an exploded view of a lighting apparatus 800 according to another implementation. The lighting apparatus includes a light-diffusive plate 802, first and second electrically conductive sheets 806 and 808, and an electrically insulative sheet 810 disposed between the first and second electrically conductive sheets. The first and second electrically conductive sheets 806 and 808, which are illustrated with thicker line segments, may be aluminum or copper, depending on implementation requirements. Also, the thickness of the electrically conductive sheets may vary, such as from foil to thicker sheets. The evenness of current distribution and ability to dissipate heat by the electrically conductive sheets may vary according to the surface area and thickness of the sheets.

The light-diffusive plate 802 has opposing first and second faces 820 and 822 that are bounded by one or more sides. In the illustrated example, the light-diffusive plate is rectangular and has four sides, with sides 812 and 814 exposed and sides 816 and 818 hidden in the view. The first face 820 is mostly obscured by the electrically conductive sheet 806, and the opposing second face 822 is hidden in the view. The light-diffusive plate may be transparent or translucent depending on implementation requirements.

In one implementation, the light-diffusive plate is made from a transparent thermoplastic such as polymethyl methacrylate (PMMA or "acrylic glass"). The light-diffusive plate 802 may be any polygon or a shape bounded by one or more curved sides, such as a circle, ellipse, or an irregular shape.

The first electrically conductive sheet 806 is disposed on the first face 820 of the light-diffusive plate 802 and may be attached to the light-diffusive plate with adhesive between edge areas of the electrically conductive sheet and the light-diffusive plate. In alternative implementations, a frame (not shown) may hold together the electrically conductive sheets 806 and 808, the insulative sheet 810, and the light-diffusive plate.

The electrically insulative sheet 810 is disposed on the first electrically conductive sheet 806 and insulates the first electrically conductive sheet from the second electrically conductive sheet 808. Adhesive may be used to attach the electrically insulative sheet to the first electrically conductive sheet, and the second electrically conductive sheet to the electrically insulative sheet. The electrically conductive sheets 806 and 808 may include respective tabs 844 and 846 for connecting to a power source.

The electrically conductive sheets 806 and 808 and the insulative sheet 810 have respective sets of openings that are aligned. For example, one of the openings in electrically conductive sheet 806 is opening 819, which is aligned with opening 821 in the electrically insulative sheet 810 and with opening 823 in the electrically conductive sheet 808. The alignment of the openings permits the SSL elements to be disposed in the openings and connected to the electrically conductive sheets. For example, one of the SSL elements is SSL element 825, which is disposed within the openings 819, 821, and 823. The SSL elements are arranged such that light-emitting portions of the SSL elements are directed at face 820 of the light-diffusive plate. The SSL elements 124 may be packaged SSL elements or bare dice.

Each of the SSL elements has at least an anode and a cathode for connecting to the electrically conductive sheets. In an example implementation, the anodes and cathodes of the SSL elements are wire bonded to the electrically conductive sheets. For example, SSL element 827 is connected to the electrically conductive sheet 806 with bond wire 829 and connected to the electrically conductive sheet 808 with bond wire 831. Though not shown, a current control device, such as a resistor, may be coupled between one of the anode or cathode and the electrically conductive sheets. In addition and though not shown, it will be appreciated that the SSL elements may have control terminals. The control terminals may enable dimming, adjusting of color-tone, and turning-on and turning-off power to the SSL elements.

The pattern of the openings in the conductive and insulative sheets and the arrangement of SSL elements may be varied according to implementation requirements. For example, different implementations may call for different sizes, numbers, and/or locations of the SSL elements on the light-diffusive plate 802.

The lighting apparatus 808 has anodes of the SSL elements connected to the electrically conductive plate 806 and the cathodes of the SSL elements connected to the electrically conductive plate 808. It will be appreciated that in an alternative implementation, the cathodes of the SSL elements may be connected to the electrically conductive plate 806 and the anodes of the SSL elements may be connected to the electrically conductive plate 808.

Figure 9:
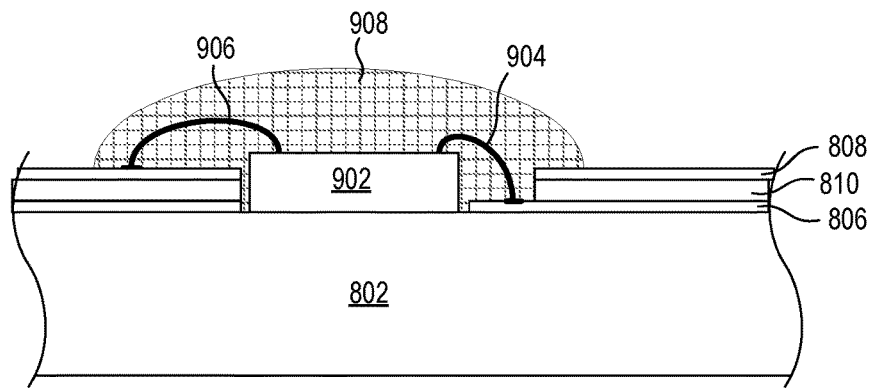
FIG. 9 is a side, cross-sectional view of a portion of a back-lit lighting apparatus similar to the lighting apparatus of FIG. 8.

FIG. 9 is a side, cross-sectional view of a portion of a back-lit lighting apparatus similar to the lighting apparatus 800 of FIG. 8. SSL elements 902 is disposed in the aligned openings of the electrically conductive sheets 806 and 808 and electrically insulative sheet 810. The SSL elements is mechanically and electrically connected to the electrically conductive sheets 806 and 808 by bond wires 904 and 906, respectively.

The openings in the electrically conductive sheet 808 and in the electrically insulative sheet 810 are larger than the opening in the electrically conductive sheet 806. The larger size openings in the electrically conductive sheet 808 and in the electrically insulative sheet 810 permit the bond wire 904 to attach to the electrically conductive sheet 806.

The SSL element is encapsulated in jettable material 908, such as a silicone. The encapsulation of the SSL element seals and protects the bond wires 904 and 906 and the connections from impacts and corrosive contaminants.

Figure 10:
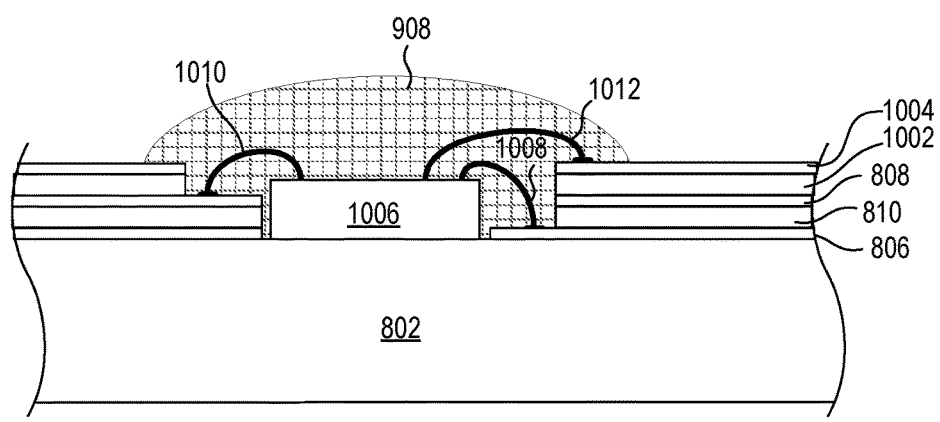
FIG. 10 is a side, cross-sectional view of a portion of a back-lit lighting apparatus similar to the lighting apparatus of FIG. 8, with an additional electrically insulative layer and electrically conductive layer.

FIG. 10 is a side, cross-sectional view of a portion of a back-lit lighting apparatus similar to the lighting apparatus 800 of FIG. 8, with an additional electrically insulative layer and electrically conductive layer. The additional electrically insulative layer 1002 and electrically conductive layer 1004 may be used to provide a control signal to the SSL element 1006. The control signal may be for dimming, adjusting of color-tone, and turning-on and turning-off power to the SSL elements.

The openings in the electrically conductive sheet 1004 and in the electrically insulative sheet 1002 are larger than the openings in the electrically conductive sheet 808 and in the electrically insulative sheet 810, and the openings in the electrically conductive sheet 808 and in the electrically insulative sheet 810 are larger than the opening in the electrically conductive sheet 806. The progressively larger openings permit the bond wire 1008 to attach to the electrically conductive sheet 806, bond wire 1010 to attach to the electrically conductive sheet 808, and bond wire 1012 to attach to electrically conductive sheet 1004. The SSL element is encapsulated in jettable material 516.

Figure 11:
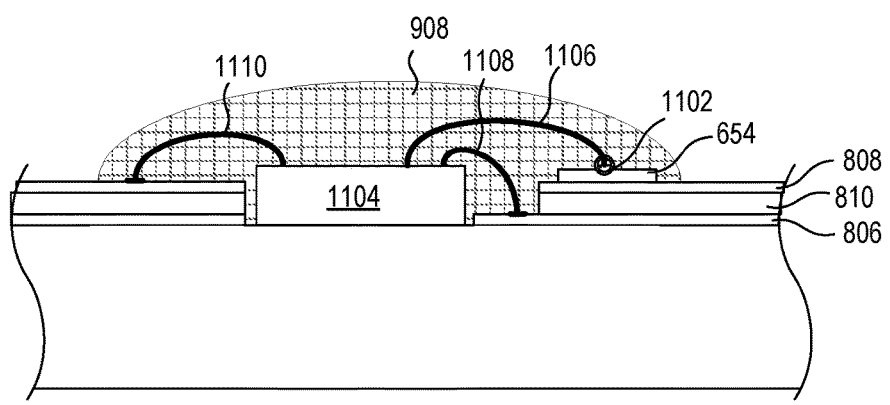
FIG. 11 is a side, cross-sectional view of a portion of a back-lit lighting apparatus similar to the lighting apparatus of FIG. 8, with an additional control wire.

FIG. 11 is a side, cross-sectional view of a portion of a back-lit lighting apparatus similar to the lighting apparatus 800 of FIG. 8, with an additional control wire 1102. The additional control wire 1102 may be used to provide a control signal to the SSL element 1104. The control signal may be for dimming, adjusting of color-tone, and turning-on and turning-off power to the SSL elements.

In one implementation, the wire 1102 is an insulated wire and is disposed on a surface of the electrically conductive sheet 808. The wire may be attached to the electrically conductive sheet using a pressure sensitive adhesive, for example. The wire may be a fine gauge, round (round cross-section), bare wire. For example, 44 gauge (AWG) copper wire has been found to be suitable for some applications. However, different gauges may be suitable for different applications. "Wire" as used herein does not refer to printed or printed-and-etched patterns of conductive material. Rather, as used herein wire refers to one or more strands of conductive material that have been made by drawing the conductive material through draw plates, for example.

The connecting portions of the wire 1102 have planar landing areas to which bond wires from the SSL elements s may be connected. The planar landing areas extend longitudinally (lengthwise) along the wire. The connecting portions of the wire may be milled to form the planar landing areas on the wire. Alternatively, connecting portions of the wire may be stamped to form the planar landing areas and the insulation may be stripped from the portions of the wire to which the bond wires are to connect, leaving insulation between the wire and the electrically insulative sheet 808. Bond wire 1106 connects the SSL element 1106 to the planar landing area of the wire 1102. In an example implementation, the wire 1102 is copper, and the bond wire 1106 is either gold or aluminum. Aspects of wire bonding to a round wire are also described in the co-pending U.S. patent application Ser. No. 14/553,519, entitled, "Wire Bonded IC Components to Round Wire," filed on Nov. 25, 2014 by Scott Lindblad et al., and is assigned to the same assignee as the present application, and the entire contents of the co-pending patent application Ser. No. 14/553,519 are incorporated herein by reference. The entire contents of co-pending patent application Ser. No. 14/928,289, entitled, "Wire Bonded Electronic Devices to Round Wire," filed on Oct. 30, 2015, by Robert Neuman, and is assigned to the same assignee as the present application, are incorporated herein by reference.

The openings in the electrically conductive sheet 808 and in the electrically insulative sheet 810 are larger than the opening in the electrically conductive sheet 806. The progressively larger openings permit the bond wire 1108 to attach to the electrically conductive sheet 806 and bond wire 1110 to attach to the electrically conductive sheet 808. The SSL element is encapsulated in jettable material 908.

Figures 12, 13:
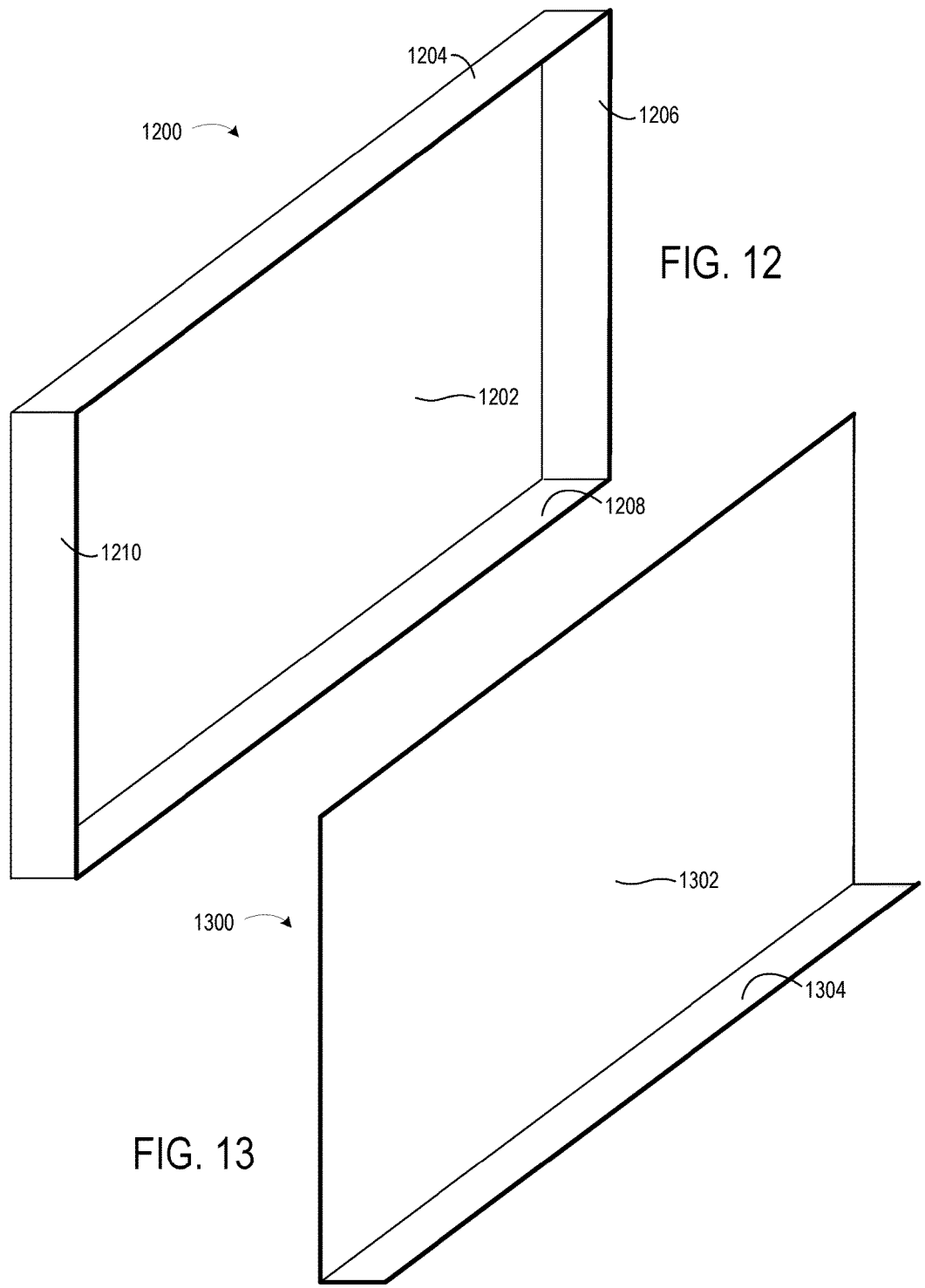
FIG. 12 shows an enclosure.
FIG. 13 shows a heat sink.

FIG. 12 shows an enclosure 1200. The enclosure 1200 may be combined with either the lighting apparatus 100 of FIG. 1 or the lighting apparatus 800 of FIG. 8. The enclosure may be constructed with sheet metal and serve as both a heat sink for the SSL elements s in the lighting apparatus and as an enclosure to maintain the structural relationships between the light-diffusive plate, electrically conductive sheets, and electrically insulative sheet(s) of the different lighting apparatuses as described above. The enclosure may be any type of metal suitable for an intended application.

The enclosure includes a back portion 1202 that is bounded by sides 1204, 1206, 1208, and 1210. A lighting apparatus may be disposed within the recess of the enclosure formed by the sides 1204, 1206, 1208, and 1210 such that the light-emitting face (e.g., face 122 in FIG. 1 and face 822 in FIG. 8) of the light-diffusive plate faces the open portion of the enclosure. Though not shown, it will be recognized that an additional electrically insulative sheet may be disposed between the back portion 1202 and the electrically conductive sheet (108 of FIG. 1 or 808 of FIG. 8) of the lighting apparatus. In an example implementation, sides may have portions that are bent inward toward the opening of the enclosure to secure the lighting apparatus within the enclosure.

FIG. 13 shows a heat sink 1300. The heat sink 1300 may be combined with either the lighting apparatus 100 of FIG. 1 or the lighting apparatus 800 of FIG. 8 and may be constructed with sheet metal, which serves as a heat sink for the SSL elements in the lighting apparatus. The heat sink includes a back portion 1302 and a side 1304. A lighting apparatus may be disposed against the heat sink such that the light-emitting face (e.g., face 122 in FIG. 1 and face 822 in FIG. 8) of the light-diffusive plate faces away from the back portion 1302, and the SSL elements in the SSL element carrier 126 contact or nearly conact the side 1304. Though not shown, it will be recognized that an additional electrically insulative sheet may be disposed between the back portion 1302 and the electrically conductive sheet (108 of FIG. 1 or 808 of FIG. 8) of the lighting apparatus. For the lighting apparatus 800, the side 1304 may be unnecessary, and the heat sink may comprise only the back portion 1302, which is disposed against the SSL elements, such as SSL element 825 in FIG. 8. The heat sink may be any type of metal suitable for an intended application.

Though aspects and features may in some cases be described in individual figures, it will be appreciated that features from one figure can be combined with features of another figure even though the combination is not explicitly shown or explicitly described as a combination.

The present invention is thought to be applicable to a variety of lighting applications. Other aspects and embodiments will be apparent to those skilled in the art from consideration of the specification and practice disclosed herein. It is intended that the disclosed apparatus and method be considered as examples only, with a true scope of the invention being indicated by the following claims.

What is claimed is:

1. A lighting apparatus, comprising:
   a light-diffusive plate having opposing first and second faces bounded by one or more sides;
   a first electrically conductive sheet disposed on the first face of the light-diffusive plate;
   a first electrically insulative sheet disposed on the first electrically conductive sheet;
   a second electrically conductive sheet disposed on the first electrically insulative sheet; and
   a first plurality of solid-state lighting (SSL) elements having light emitting portions that face a portion of the light-diffusive plate, the first plurality of SSL elements electrically coupled to the first electrically conductive sheet and to the second electrically conductive sheet;
   a first SSL element carrier attached to the light-diffusive plate, wherein the first plurality of SSL elements is disposed on a first portion of the SSL element carrier and the light emitting portions of the SSL elements face a first side of the one or more sides of the light-diffusive plate, and the first SSL element carrier has a second portion having first terminals and second terminals coupled to the plurality of SSL elements;
   wherein:

the light-diffusive plate has a plurality of disruptions on the first face of the opposing faces;
the first electrically conductive sheet is electrically coupled to the first terminals; and
the second electrically conductive sheet is electrically coupled to the second terminals.

2. The lighting apparatus of claim 1, wherein:
the second portion of the first SSL element carrier has first and second surfaces, the first surface of the second portion having the first terminals facing the first face of the light-diffusive plate, and the second surface of the second portion facing away from the first face of the light diffusive plate and having the second terminals;
the first electrically conductive sheet is directly electrically coupled to the first terminals; and
the second electrically conductive sheet is directly electrically coupled to the second terminals.

3. The lighting apparatus of claim 1, wherein the first electrically conductive sheet is one of an aluminum sheet or a copper sheet.

4. The lighting apparatus of claim 3, wherein the second electrically conductive sheet is one of an aluminum sheet or a copper sheet.

5. The lighting apparatus of claim 1, wherein the first electrically conductive sheet is one of an aluminum foil or a copper foil.

6. The lighting apparatus of claim 5, wherein the second electrically conductive sheet is one of an aluminum foil or a copper foil.

7. The lighting apparatus of claim 1, further comprising a reflector disposed between the first face of the light-diffusive plate and a surface of the first electrically conductive sheet that faces the first face of the light-diffusive plate.

8. The lighting apparatus of claim 1, wherein the first terminals are copper, the first electrically conductive sheet is aluminum, and the first electrically conductive sheet is directly coupled to the first terminals with a weld joint.

9. The lighting apparatus of claim 8, wherein the second terminals are copper, the second electrically conductive sheet is aluminum, and the second electrically conductive sheet is directly coupled to the second terminals with a weld joint.

10. The lighting apparatus of claim 1, further comprising:
a second SSL element carrier attached to the light-diffusive plate and having a second plurality of SSL elements disposed on a first portion and the second plurality of SSL elements facing a second side of the one or more sides of the light-diffusive plate, the second SSL element carrier having a second portion having third terminals and fourth terminals;
wherein:
the first electrically conductive sheet is coupled to the third terminals; and
the second electrically conductive sheet is coupled to the fourth terminals.

11. The lighting apparatus of claim 1, wherein:
the light-diffusive plate has a first channel along at least a portion of the first side of the one or more sides; and
the first plurality of SSL elements on the first portion of the first SSL element carrier are disposed within the first channel.

12. The lighting apparatus of claim 11, further comprising an ultra-violet (UV) curable encapsulant that fills the first channel.

13. The lighting apparatus of claim 1, wherein the first SSL element carrier is one of a lead frame, a rigid substrate, or a flexible substrate.

14. The lighting apparatus of claim 1, further comprising:
a second electrically insulative sheet disposed on the second electrically conductive sheet; and
a metal sheet disposed on the second electrically insulative sheet and having a portion disposed against the first portion of the SSL element carrier.

15. A lighting apparatus, comprising:
a light-diffusive plate having opposing first and second faces bounded by one or more sides;
a first electrically conductive sheet disposed on the first face of the light-diffusive plate;
a first electrically insulative sheet disposed on the first electrically conductive sheet;
a second electrically conductive sheet disposed on the first electrically insulative sheet; and
a first plurality of solid-state lighting (SSL) elements having light emitting portions that face a portion of the light-diffusive plate, the first plurality of SSL elements electrically coupled to the first electrically conductive sheet and to the second electrically conductive sheet;
wherein;
the first electrically conductive sheet has a first plurality of openings that are aligned with a second plurality of openings in the first electrically insulative sheet and a third plurality of openings in the second electrically conductive sheet; and
the first plurality of SSL elements are disposed in first plurality of openings, respectively, and the light emitting portions of the SSL elements face the first face of the light-diffusive plate.

16. The lighting apparatus of claim 15, wherein:
the first plurality of SSL elements are wire bonded to the to the first electrically conductive sheet and to the second electrically conductive sheet.

17. The lighting apparatus of claim 16, wherein the first, second, and third pluralities of openings are filled with an encapsulent that individually covers each of plurality of SSL elements and connected bond wires.

18. The lighting apparatus of claim 15, further comprising:
a second electrically insulative sheet having a fourth plurality of openings aligned with the third plurality of openings of the second electrically conductive sheet and disposed on the second electrically conductive sheet;
a third electrically conductive sheet having a fifth plurality of openings aligned with the fourth plurality of openings of the second electrically insulative sheet and disposed on the second electrically insulative sheet;
wherein the first plurality of SSL elements have control terminals coupled to the third electrically conductive sheet.

19. The lighting apparatus of claim 18, wherein:
the first plurality of SSL elements are wire bonded to the to the first electrically conductive sheet, to the second electrically conductive sheet, and to the third electrically conductive sheet.

20. The lighting apparatus of claim 15, further comprising:
a control wire having an electrically insulative jacket disposed on the second electrically conductive sheet;
wherein the first plurality of SSL elements have control terminals coupled to the control wire.

21. The lighting apparatus of claim 20, wherein:
the first plurality of SSL elements are wire bonded to the to the first electrically conductive sheet, to the second electrically conductive sheet, and to the control wire.

22. The lighting apparatus of claim 20, wherein the first, second, and third pluralities of openings are filled with an encapsulent that individually covers each of plurality of SSL elements and connected bond wires.

23. The lighting apparatus of claim 15, further comprising a second electrically insulative sheet disposed on the second electrically conductive sheet.

24. A method of making a lighting apparatus, comprising:
disposing a first electrically conductive sheet on a first face of the light-diffusive plate, the light-diffusive plate having opposing first and second faces bounded by one or more sides;
connecting a plurality of solid-state lighting (SSL) elements to the first electrically conductive sheet with the plurality of SSL elements arranged to emit light toward a portion of the light-diffusive plate;
disposing an electrically insulative sheet on the first electrically conductive sheet;
disposing a second electrically conductive sheet on the electrically insulative sheet;
connecting the plurality of SSL elements to the second electrically conductive sheet;
forming disruptions on the first face of the light-diffusive plate;
attaching the plurality of SSL elements to a first portion an SSL element carrier, wherein the SSL element carrier includes first terminals and second terminals coupled to the SSL elements;
attaching the SSL element carrier to the light-diffusive plate, wherein the plurality of SSL elements are arranged to emit light toward a first side of the one or more sides of the light-diffusive plate, and the first terminals face the first electrically conductive sheet;
connecting the first terminals to the first electrically conductive sheet;
disposing an electrically insulative sheet on the first electrically conductive sheet, leaving the second terminals exposed; and
disposing a second electrically conductive sheet on the electrically insulative sheet; and
connecting the second terminals to the second electrically conductive sheet.

25. The method of claim 24, wherein the connecting the first terminals to the first electrically conductive sheet includes welding the first terminals to the first electrically conductive sheet.

26. The method of claim 25, wherein the connecting the second terminals to the second electrically conductive sheet includes welding the second terminals to the second electrically conductive sheet.

27. The method of claim 24, wherein the disposing of the first electrically conductive sheet on the first face of the light-diffusive plate includes disposing one of an aluminum sheet or a copper sheet on the first face of the light-diffusive plate.

28. The method of claim 27, wherein the disposing of the second electrically conductive sheet on the electrically insulative sheet includes disposing one of an aluminum sheet or a copper sheet on the electrically insulative sheet.

29. The method of claim 24, wherein the disposing of the first electrically conductive sheet on the first face of the light-diffusive plate includes disposing one of an aluminum foil or a copper foil on the first face of the light-diffusive plate.

30. The method of claim 29, wherein the disposing of the second electrically conductive sheet on the electrically insulative sheet includes disposing one of an aluminum foil or a copper foil on the electrically insulative sheet.

31. The method of claim 24, wherein the first terminals are copper, the first electrically conductive sheet is aluminum, and the connecting the first terminals to the first electrically conductive sheet includes welding the first terminals to the first electrically conductive sheet.

32. The method of claim 31, wherein the second terminals are copper, the second electrically conductive sheet is aluminum, and the connecting the second terminals to the second electrically conductive sheet includes welding the second terminals to the second electrically conductive sheet.

33. The method of claim 24, further comprising:
forming a first channel along at least a portion of the first side of the one or more sides of the light-diffusive plate; and
wherein the attaching of the SSL element carrier to the light-diffusive plate includes disposing the plurality of SSL elements within the first channel.

34. The method of claim 33, further comprising:
filling the first channel with an ultra-violet (UV) curable encapsulant; and
curing the encapsulant in the first channel.

35. A method of making a lighting apparatus, comprising:
disposing a first electrically conductive sheet on a first face of the light-diffusive plate, the light-diffusive plate having opposing first and second faces bounded by one or more sides;
connecting a plurality of solid-state lighting (SSL) elements to the first electrically conductive sheet with the plurality of SSL elements arranged to emit light toward a portion of the light-diffusive plate;
disposing an electrically insulative sheet on the first electrically conductive sheet;
disposing a second electrically conductive sheet on the electrically insulative sheet;
connecting the plurality of SSL elements to the second electrically conductive sheet;
wherein the first electrically conductive sheet has a first plurality of openings aligned with a second plurality of openings in the first electrically insulative sheet and a third plurality of openings in the second electrically conductive sheet; and
disposing the plurality of SSL elements in the first, second, and third plurality of openings, with the light emitting portions of the SSL elements facing the first face of the light-diffusive plate.

36. The method of claim 35, further comprising wire bonding the plurality of SSL elements to the first electrically conductive sheet and to the second electrically conductive sheet with bond wires.

37. The lighting apparatus of claim 36, further comprising individually encapsulating each SSL element of the plurality of SSL elements, wherein the first, second, and third pluralities of openings are filled with an encapsulent that individually covers each of plurality of SSL elements and connected bond wires.

38. The method of claim 35, further comprising:
disposing a second electrically insulative sheet on the second electrically conductive sheet, the second electrically insulative sheet having a fourth plurality of openings aligned with the third plurality of openings of the second electrically conductive sheet;
disposing a third electrically conductive sheet on the second electrically insulative sheet, the third electrically conductive sheet having a fifth plurality of openings aligned with the fourth plurality of openings of the second electrically insulative sheet;

wherein the first plurality of SSL elements have control terminals coupled to the third electrically conductive sheet.

39. The method of claim 38, further comprising wire bonding the first plurality of SSL elements to the first electrically conductive sheet, to the second electrically conductive sheet, and to the third electrically conductive sheet.

40. The method of claim 35, further comprising:

attaching a control wire having an electrically insulative jacket to the second electrically conductive sheet; and connecting control terminals of the first plurality of SSL elements to the control wire.

41. The method of claim 40, further comprising wire bonding the first plurality of SSL elements to the first electrically conductive sheet, to the second electrically conductive sheet, and to the control wire.

* * * * *